(12) United States Patent
Rulkens et al.

(10) Patent No.: US 7,913,644 B2
(45) Date of Patent: Mar. 29, 2011

(54) ELECTROLESS DEPOSITION SYSTEM

(75) Inventors: Ron Rulkens, Milpitas, CA (US);
Robert D. Tas, Aromas, CA (US);
Shashank Ravindra Kulkarni, Santa Clara, CA (US); Artur Kolics, Dublin, CA (US); Nancy E. Gilbert, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 1179 days.

(21) Appl. No.: 11/537,643

(22) Filed: Sep. 30, 2006

(65) Prior Publication Data
US 2009/0288593 A1 Nov. 26, 2009

Related U.S. Application Data

(60) Provisional application No. 60/723,180, filed on Sep. 30, 2005.

(51) Int. Cl.
*B05C 3/02* (2006.01)
(52) U.S. Cl. ...... 118/407; 118/422; 118/429; 260/121.1

(58) Field of Classification Search .............. 118/407, 118/422, 429; 204/224 R, 232, 234, 237, 204/242, 275.1, 277; 134/102.2, 102.1; 438/678; 261/121.1; 427/437
See application file for complete search history.

(56) References Cited

U.S. PATENT DOCUMENTS

| | | | |
|---|---|---|---|
| 3,753,768 A * | 8/1973 | Ichiki et al. | .......... 427/253 |
| 6,165,912 A | 12/2000 | McConnell et al. | |
| 6,713,377 B2 | 3/2004 | Lee et al. | |
| 6,902,605 B2 | 6/2005 | Kolics et al. | |
| 2002/0130441 A1 * | 9/2002 | Robinson et al. | ............ 264/442 |
| 2003/0219976 A1 | 11/2003 | Gleason | |
| 2005/0136193 A1 | 6/2005 | Weidman et al. | |

FOREIGN PATENT DOCUMENTS

WO        WO 99/57340        * 11/1999
* cited by examiner

*Primary Examiner* — Laura Edwards
(74) *Attorney, Agent, or Firm* — Martine Penilla & Gencarella, LLP

(57) ABSTRACT

An electroless deposition system includes a deposition solution, and saturating the deposition solution with an oxygen concentration in a range from about two thousand parts per million to about twenty thousand parts per million.

9 Claims, 5 Drawing Sheets

ELECTROLESS DEPOSITION SYSTEM

CROSS-REFERENCE TO RELATED APPLICATION(S)

This application claims the benefit of U.S. Provisional Patent Application Ser. No. 60/723,180 filed Sep. 30, 2005.

TECHNICAL FIELD

The present invention relates generally to deposition systems, and more particularly to a system for electroless deposition.

BACKGROUND ART

Currently, there are various techniques being used in the electronic component industry for depositing or plating metal (e.g., copper, cobalt, gold, and nickel) onto the surfaces of electronic components. Such methods include, for example, chemical vapor deposition, metal sputtering, electroplating, and electroless metal deposition.

Electroless metal deposition has become more popular in recent years and involves depositing metal onto the surfaces of electronic components in the absence of an electrical current (i.e., electrolessly).

Examples of where electroless metal deposition has been used in the electronic assembly industry are in the deposition of copper on printed circuit boards. In addition, in semiconductors, electroless deposition is used to deposit nickel on bonding packs, and in multichip modules, electroless deposition is used to deposit copper interconnects.

Electroless deposition of metal is typically carried out by first "activating" the surface of an electronic component by seeding or depositing a substance that will promote metal deposition onto the electronic component surface. However, it is possible that seeding will not be necessary. For example, on a substrate containing cobalt, nickel, rhodium, or palladium, seeding may not be necessary to promote metal deposition. Seeding, when desired, can be accomplished for example through immersing the electronic component in a solution containing a seeding agent.

Following activation, the electronic component is typically immersed in a solution that contains metal ions and a reducing agent. The reducing agent provides a source of electrons for the metal ions, so that metal ions near or at the surfaces of the electronic components are reduced to metal and plated out onto the electronic components.

A wide variety of stabilizers is used today, falling into at least four categories: 1) compounds of group VI elements, 2) compounds containing oxygen, 3) heavy metal cations, and 4) Unsaturated organic acids. Many of the stabilizers currently in use prevent plating on small isolated Cu features, especially under agitated plating conditions, i.e. they do not provide solution stability and small isolated feature plating. Current attempts provide the ability to plate on small isolated features with an unstable plating bath, or provide bath stability without the ability to plate on small isolated features.

Across virtually all applications, there continues to be growing demand for smaller features and increasing performance of integrated circuits. The seemingly endless restrictions and requirements are no more visible than with products in our daily lives. Smaller and denser integrated circuits are expected in many portable electronic products as well as in many larger electronic systems. As the demand grows for smaller electronic products with more features, manufacturers are seeking ways to include more functions within the same or smaller product form factors.

Thus, a need still remains for an electroless deposition system to provide improved stability and small isolated feature deposition. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an electroless deposition solution, and saturating the deposition solution with an oxygen concentration in a range from about two thousand parts per million to about twenty thousand parts per million.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
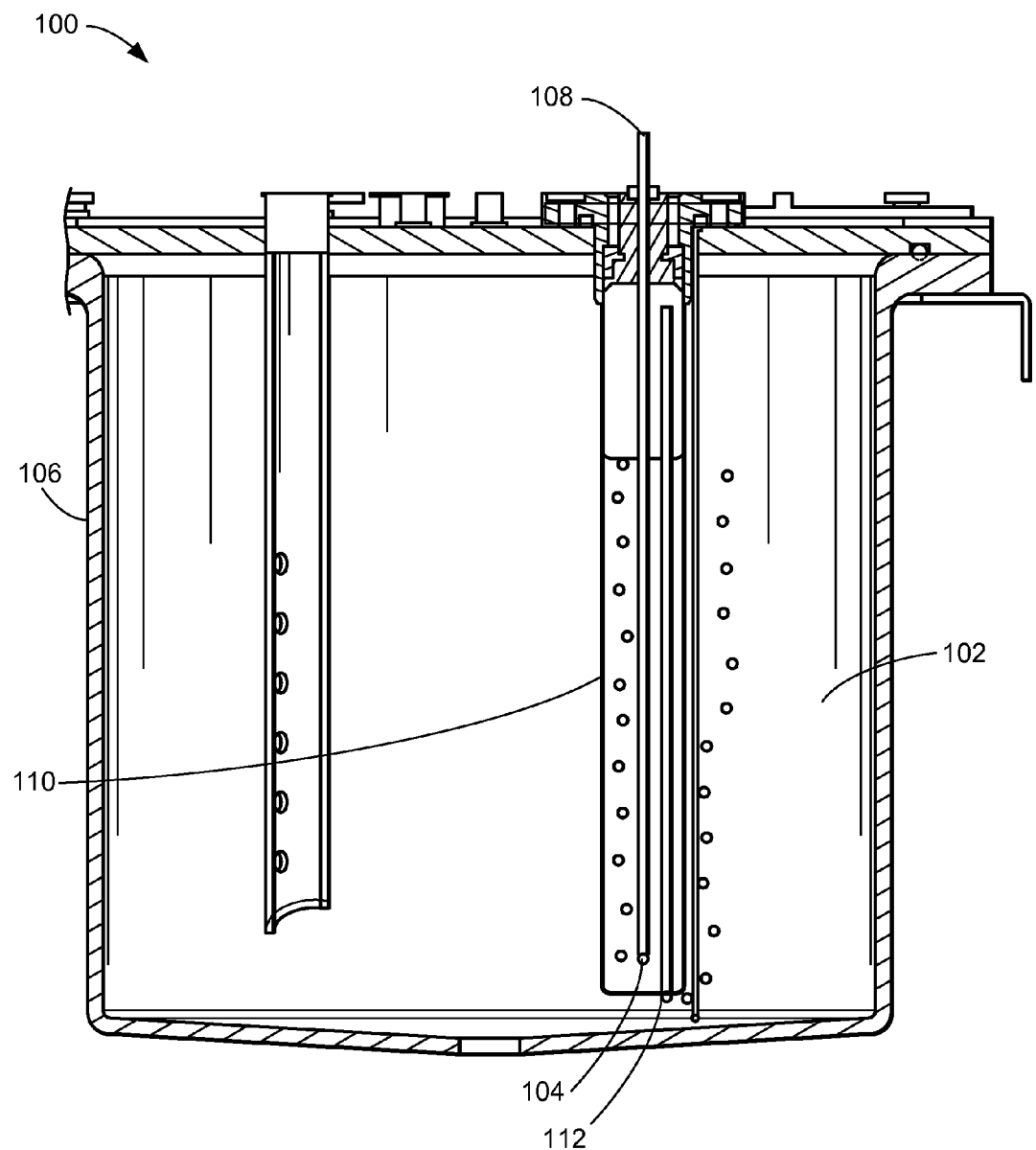
FIG. 1 is a cross-sectional view of an electroless deposition system in an embodiment of the present invention in a solution preparation phase.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes stamping, forging, patterning, exposure, development, etching, cleaning, and/or removal of the material or laser trimming as required in forming a described structure. The term "system" as used herein means and refers to the method and to the apparatus of the present invention in accordance with the context in which the term is used.

Referring now to FIG. 1, therein is shown a cross-sectional view of an electroless deposition system 100 in an embodiment of the present invention in a solution preparation phase. The electroless deposition system 100 includes a deposition solution 102, such as an electroless deposition solution. The electroless deposition solution 102, such as a plating bath, is saturated to an oxygen level in a predetermined range. Oxygen 104 is introduced, such as bubbling, into the electroless deposition solution 102. The oxygen 104 can be part of a mixture including an inert gas, such as nitrogen. The oxygen 104 can be dissolved in the electroless deposition solution 102 in a solution storage tank 106, such as a "Blue 29 CuSeal CDU". The solution storage tank can include an inlet 108, a dispenser 112, and optionally a humidifier 110. The inlet 108 provides introduction of the oxygen 104 into the electroless deposition system 100. The dispenser 112 is provided for bubbling the oxygen through the electroless deposition solution. In one embodiment, the dispenser 112 bubbles an inert gas and oxygen through the electroless deposition solution. In one embodiment, the dispenser bubbles nitrogen and oxygen through the electroless deposition solution. In one embodiment, the dispenser 112 bubbles oxygen through the electroless deposition solution for a predetermined time. In one embodiment, the dispenser is provided for replenishing de-ionized water in the electroless deposition solution.

The electroless deposition solution 102 requires saturation of oxygen to the predetermined range and can require additional de-ionized water (DI water). The de-ionized water can be added by humidifying the oxygen 104 through the humidifier 110. Oxygen bubbled through the humidifier 110 includes additional de-ionized water as it is introduced into the electroless deposition solution 102 via the dispenser 112. De-ionized water can also be added by a replenishment process wherein de-ionized water is introduced to the electroless deposition solution 102 without the need for the humidifier 110.

It has been unexpectedly discovered that the electroless deposition system 100 provides both plating on an outlier feature (not shown), such as smaller than five hundred nanometers and isolated by one thousand nanometers, as well as stability for the electroless deposition solution 102.

Figure 2A:
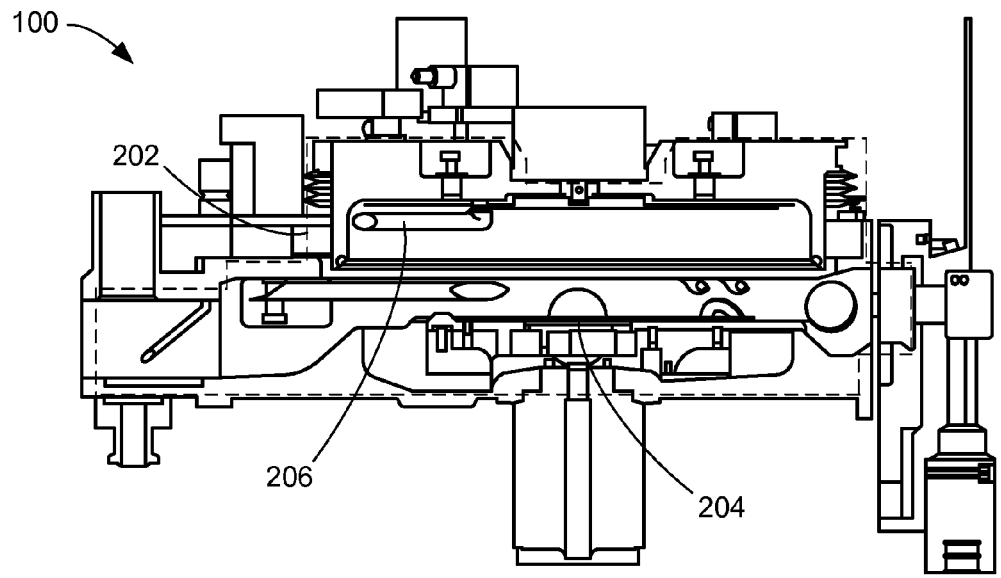
FIG. 2A is a cross-sectional view of the electroless deposition system in a surface treatment phase.

Referring now to FIG. 2A, therein is shown a cross-sectional view of the electroless deposition system 100 in a surface treatment phase. The electroless deposition system 100 includes an electroless deposition chamber 202. The electroless deposition chamber 202 includes an outer chamber 204 and a lower dispense arm 206. The lower dispense arm 206 is active and the outer chamber 204 is sealed. The outer chamber 204 can be nitrogen purged for surface treatment of a work piece (not shown). The electroless deposition chamber 202 provides control of the electroless deposition system 100 surface treatment environment including saturation of oxygen in the electroless deposition solution 102 of FIG. 1 to the predetermined range.

It has been unexpectedly discovered that maintaining the oxygen saturation of the electroless deposition solution 102 to the predetermined range provides both plating on outlier features as well as stability for the electroless deposition solution 102 in the surface treatment phase.

Figure 2B:
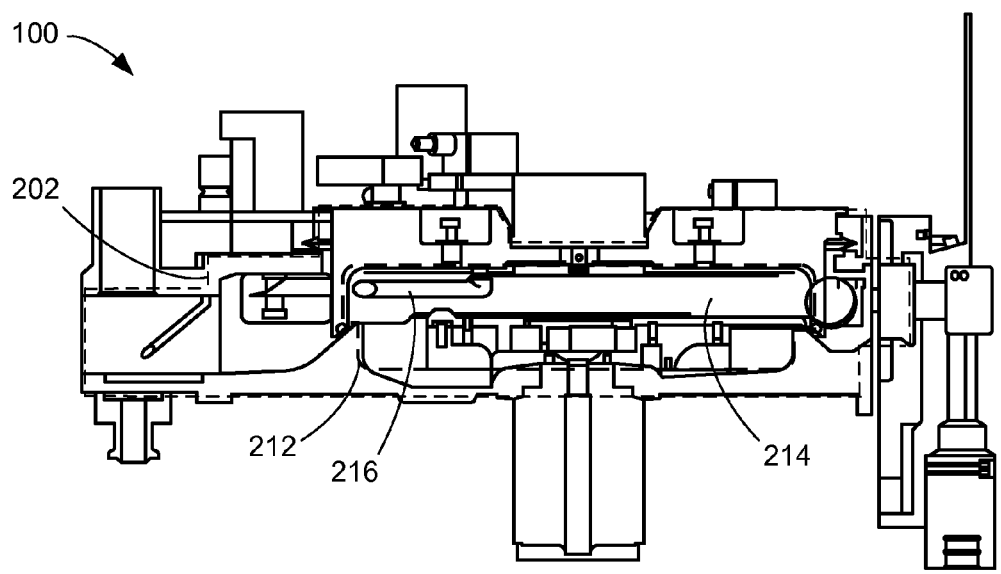
FIG. 2B is a cross-sectional view of the electroless deposition system in a deposition phase.

Referring now to FIG. 2B, therein is shown a cross-sectional view of the electroless deposition system 100 in a deposition phase. The electroless deposition system 100 includes the electroless deposition chamber 202. As in FIG. 2A, the outer chamber 204 of FIG. 2A is sealed. The electroless deposition chamber 202 includes an inner chamber 214 and an upper dispense arm 216. The upper dispense arm 216 is active and the inner chamber 214 is sealed. The inner chamber 214 can be oxygen purged for deposition of the work piece. The electroless deposition chamber 202 provides control of the electroless deposition system 100 deposition environment including saturation of oxygen in the electroless deposition solution 102 of FIG. 1 to the predetermined range.

It has been unexpectedly discovered that maintaining the oxygen saturation of the electroless deposition solution 102 to the predetermined range provides both plating on outlier features as well as stability for the electroless deposition solution 102 in the deposition phase.

Figure 3:
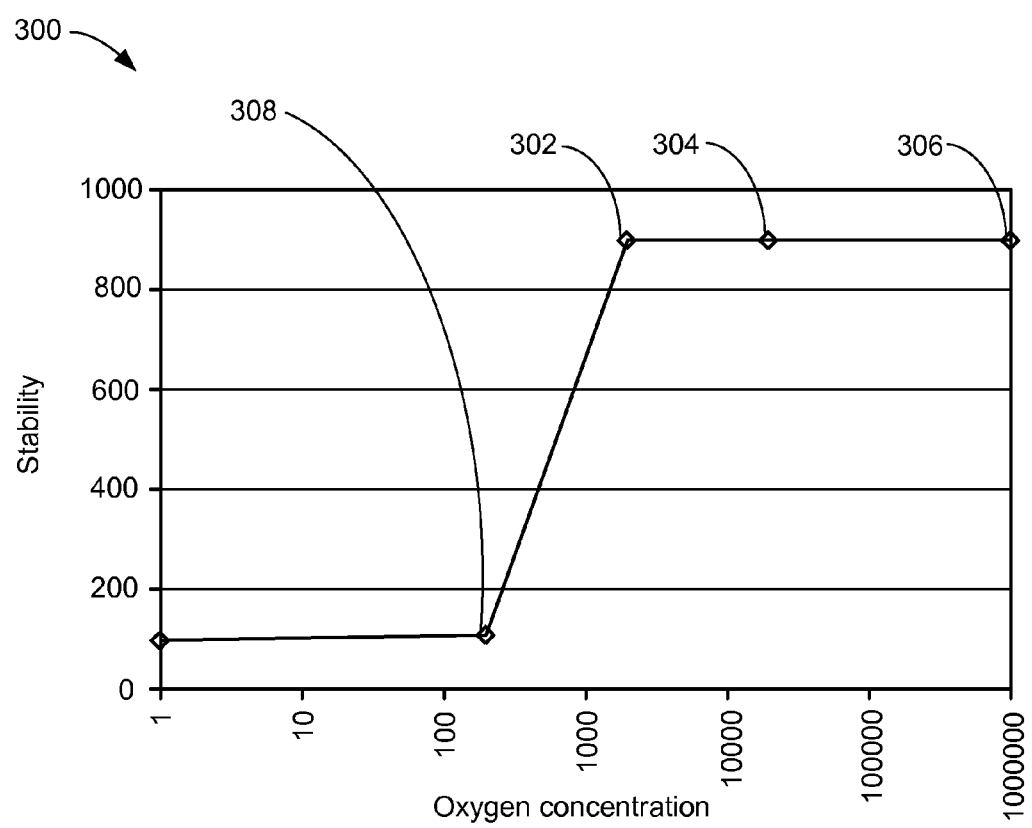
FIG. 3 is a chart of oxygen concentration versus stability of the electroless deposition solution of FIG. 1.

Referring now to FIG. 3, therein is shown a chart 300 of oxygen concentration versus stability of the electroless deposition solution 102 of FIG. 1. The chart 300 depicts stability, such as in a palladium chloride test, of the electroless deposition solution 102 of FIG. 1. Oxygen concentrations in the chart 300 include bubbling the oxygen 104 of FIG. 1 for eight minutes prior to and during the test for stability. The oxygen concentrations can be provided by any other means, including higher concentrations of the oxygen 104, such as more than two tenths of a percent to two percent oxygen in nitrogen, introduced for shorter times. An oxygen concentration of about two thousand parts per million corresponds to a saturated oxygen level in the electroless deposition solution 102 of about one part per billion. An oxygen concentration of about twenty thousand parts per million corresponds to a saturated oxygen level in the electroless deposition solution 102 of about twenty-five parts per million.

Providing the oxygen concentration of about two thousand parts per million provides a first stability point 302 of the electroless deposition solution 102. The electroless deposition solution 102 is stable through oxygen concentration of about twenty thousand parts per million at a second stability point 304. Stability continues through oxygen concentration of about one to one at a high stability point 306. The electroless deposition solution is not stable between a low stability point 308 and the first stability point 302.

It has been unexpectedly discovered that the electroless deposition solution 102 is stable between oxygen concentrations of about two thousand parts per million and twenty thousand parts per million.

Figure 4A:
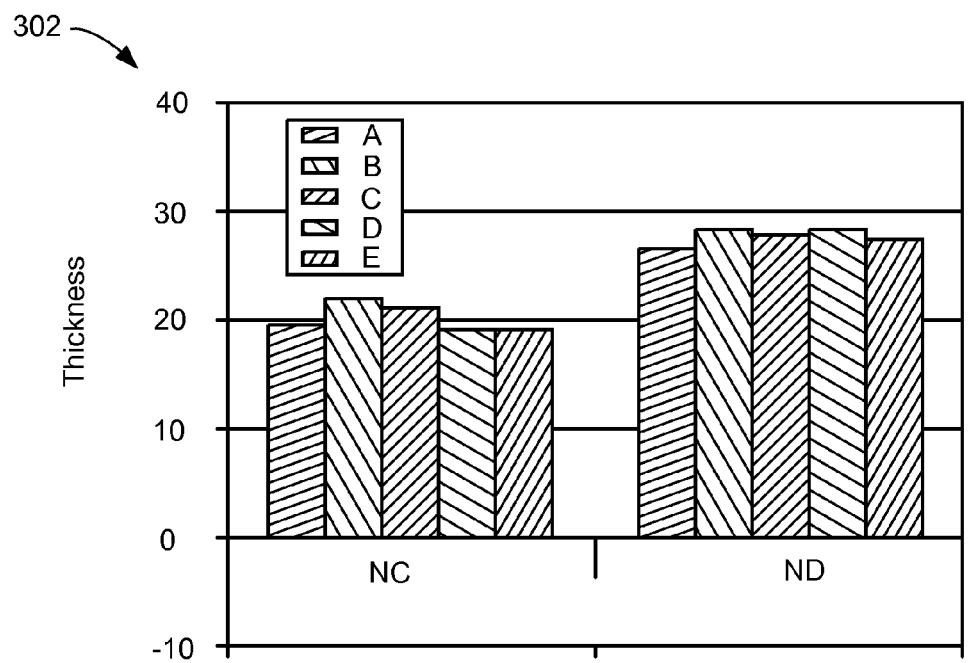
FIG. 4A is a chart of deposition layer thicknesses on the outlier feature at the first stability point of FIG. 3.

Referring now to FIG. 4A, therein is shown a chart of deposition layer thicknesses on the outlier feature at the first stability point 302 of FIG. 3. The electroless deposition solution 102 of FIG. 1 with about one part per billion of oxygen in the electroless deposition system 100 provides a deposition layer (not shown), such as elements in groups 9-11, with a thickness in a range of about twenty nanometers to about forty nanometers.

It has been unexpectedly discovered that the electroless deposition system 100 of FIG. 1 with an oxygen concentration of about two thousand parts per million provides a predetermined thickness of the deposition layer on the outlier feature, such as small isolated features.

Figure 4B:
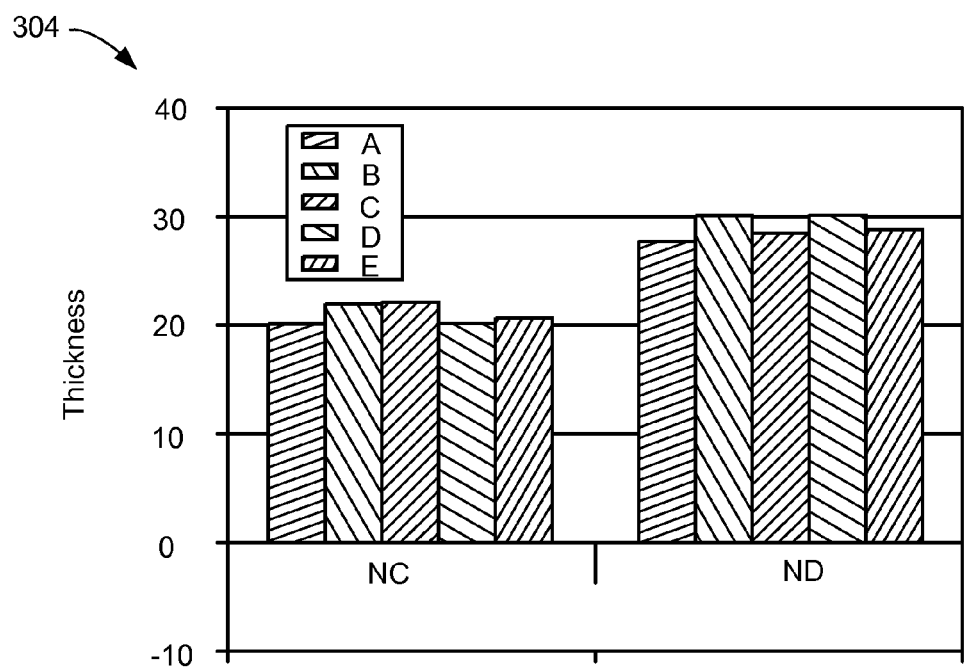
FIG. 4B is a chart of deposition layer thicknesses on the outlier feature at the second stability point of FIG. 3.

Referring now to FIG. 4B, therein is shown a chart of deposition layer thicknesses on the outlier feature at the second stability point 304 of FIG. 3. The electroless deposition solution 102 of FIG. 1 with about twenty-five parts per million of oxygen in the electroless deposition system 100 provides a deposition layer (not shown), such as elements in groups 9-11, with a thickness in a range of about twenty nanometers to about forty nanometers.

It has been unexpectedly discovered that the electroless deposition system 100 of FIG. 1 with an oxygen concentration of about twenty thousand parts per million provides a predetermined thickness of the deposition layer on the outlier feature, such as small isolated features.

Figure 5:
FIG. 5 is a flow chart of an electroless deposition system for manufacturing the electroless deposition system in an embodiment of the present invention.
Figure 5:
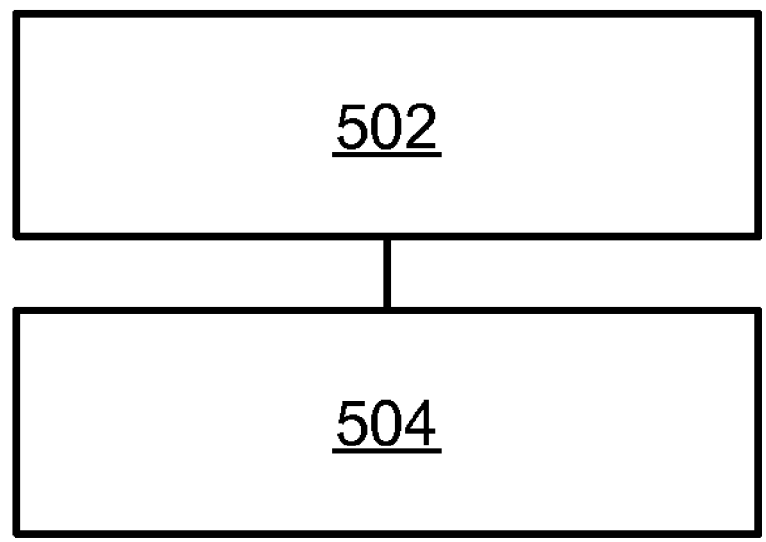

Referring now to FIG. 5, therein is shown a flow chart of an electroless deposition system 500 for manufacturing the electroless deposition system 100 in an embodiment of the present invention. The system 500 includes providing a deposition solution in a block 502; and saturating the deposition solution with an oxygen concentration in a range from about two thousand parts per million to about twenty thousand parts per million in a block 504.

In greater detail, a system to provide the method and apparatus of the electroless deposition system 100, in an embodiment of the present invention, is performed as follows:
1. Providing an electroless deposition solution.
2. Dissolving oxygen with a concentration in a range from about two thousand parts per million to about twenty thousand parts per million in the electroless deposition solution.
3. Depositing a deposition layer on an outlier feature of a work piece.

It has been discovered that the present invention thus has numerous aspects.

A principle aspect that has been unexpectedly discovered is predetermined level of oxygen. The present invention provides the predetermined level of oxygen in the electroless deposition solution.

Another aspect is that the present invention is a predetermined time for introducing oxygen. The predetermined time is based on the oxygen concentration that is introduced to the electroless deposition solution to achieve the predetermined level of oxygen.

Yet another important aspect is that the present invention de-ionized water replenishment. De-ionized water is replenished in the electroless deposition solution to compensate for evaporation during processing.

It has been discovered that the disclosed structure provides the deposition layer on the outlier feature. The outlier feature, such as small isolated features, includes a predetermined thickness of the deposition layer.

It has also been discovered that the disclosed structure provides stability of the deposition solution. The deposition solution, such as a plating or deposition bath, is stabilized, such as with palladium chloride levels.

Another discovery is that the disclosed structure provides compatibility with humidifying the oxygen with de-ionized water. De-ionized water replenishment can be provided by the humidifier for the oxygen to be introduced.

Yet another discovery is that the disclosed structure provides compatibility with replenishment processes for de-ionized water. De-ionized water can also be replenished in the electroless deposition solution by a process that does not require the humidifier.

Yet another discovery is that the disclosed structure provides compatibility with oxygen mixed with nitrogen. Oxygen can be bubbled into the electroless deposition solution with a mixture of oxygen and nitrogen.

Yet another discovery of the disclosed structure is compatibility with oxygen mixed with an inert gas. Oxygen can be bubbled into the electroless deposition solution with a mixture of oxygen and an inert gas.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the electroless deposition system, method and apparatus, of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An electroless deposition system comprising:
   an electroless deposition chamber for containing an electroless deposition solution for deposition onto a work piece;
   a portion of the electroless deposition system for saturating the electroless deposition solution with an oxygen level in a range from about two thousand parts per million to about twenty thousand parts per million;
   wherein the portion of the electroless deposition system includes an inlet for receiving an inert gas and oxygen from an inert gas source and an oxygen source, and a dispenser for bubbling an inert gas and oxygen through the electroless deposition solution and for replenishing de-ionized water in the electroless deposition solution.

2. The system as claimed in claim 1 wherein the inert gas is nitrogen.

3. The system as claimed in claim 1 wherein the portion of the electroless deposition system bubbles oxygen into the deposition solution for a predetermined time.

4. The system as claimed in claim 1 wherein the portion of the electroless deposition system includes a humidifier for humidifying the oxygen during saturation.

5. The system as claimed in claim 1 wherein the dispenser bubbles oxygen through the electroless deposition solution for a predetermined time.

6. An electroless deposition system, comprising:
   a solution storage tank for storing an electroless deposition solution, the solution storage tank including an inlet for receiving an oxygen-containing gas from a gas source, a humidifier for containing de-ionized water to humidify the oxygen-containing gas, the inlet configured to bubble the oxygen-containing gas through the humidifier, and a dispenser for bubbling the humidified oxygen-containing gas through the electroless deposition solution;

an electroless deposition chamber for applying the electroless deposition solution to a work piece;

wherein the humidifier replenishes de-ionized water to the electroless deposition solution to compensate for evaporation during processing; and wherein the bubbling of the humidified oxygen-containing gas through the electroless deposition solution saturates the electroless deposition solution with an oxygen level in a range from about two thousand parts per million to about twenty thousand parts per million, the oxygen level providing for plating on outlier features of the work piece as well as stability for the electroless deposition solution.

7. The electroless deposition system of claim 6, wherein the oxygen-containing gas includes an inert gas.

8. The electroless deposition system of claim 7, wherein the inert gas is nitrogen.

9. The electroless deposition system of claim 6, wherein the dispenser bubbles the humidified oxygen-containing gas through the electroless deposition solution for a predetermined time.

* * * * *